US009535491B2

(12) United States Patent
Drogi et al.

(10) Patent No.: US 9,535,491 B2
(45) Date of Patent: *Jan. 3, 2017

(54) POWER SUPPLY

(71) Applicant: QUANTANCE, INC., Woburn, MA (US)

(72) Inventors: Serge Francois Drogi, Flagstaff, AZ (US); Marcus Charles Mertsching, Alamo, CA (US); Luigi Panseri, Pleasanton, CA (US)

(73) Assignee: QUANTANCE, INC., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/975,068

(22) Filed: Dec. 18, 2015

(65) Prior Publication Data

US 2016/0103479 A1    Apr. 14, 2016

Related U.S. Application Data

(63) Continuation of application No. 14/208,553, filed on Mar. 13, 2014, now Pat. No. 9,225,362.

(Continued)

(51) Int. Cl.
| | |
|---|---|
| *H04B 1/04* | (2006.01) |
| *G06F 1/32* | (2006.01) |
| *H02M 3/156* | (2006.01) |
| *H02M 3/158* | (2006.01) |
| *H04B 1/16* | (2006.01) |
| *H04B 1/034* | (2006.01) |
| *H02M 1/00* | (2006.01) |

(52) U.S. Cl.
CPC ........... *G06F 1/3287* (2013.01); *G06F 1/3296* (2013.01); *H02M 3/156* (2013.01); *H02M 3/1582* (2013.01); *H04B 1/0458* (2013.01); *H04B 1/1607* (2013.01); *H02M 2001/007* (2013.01); *H02M 2001/008* (2013.01); *H02M 2001/0025* (2013.01); *H02M 2001/0045* (2013.01)

(58) Field of Classification Search
CPC ..... H03F 1/0211; H03F 1/0227; H03F 1/0238
USPC ........................................ 455/127.1; 330/297
See application file for complete search history.

(56) References Cited

U.S. PATENT DOCUMENTS 9,225,362 B2 * 12/2015 Drogi .................. H04B 1/0458
2003/0071034 A1    4/2003 Thompson et al.
(Continued)

OTHER PUBLICATIONS

International Search Report and Written Opinion from corresponding PCT Application Serial No. PCT/US2014/026009, mailed Aug. 21, 2014.

(Continued)

*Primary Examiner* — Lee Nguyen
(74) *Attorney, Agent, or Firm* — Lando & Anastasi, LLP

(57) ABSTRACT

A power supply for a radio frequency (RF) power amplifier that amplifies an RF input signal into an RF output signal and a method of operation in the power supply. The power supply comprises a first power converter to convert an input voltage to the power supply into a first supply voltage of the RF power amplifier. The power supply comprises a second power converter to receive the input voltage and the first supply voltage and to selectively convert either the input voltage or the first supply voltage into at least a portion of a second supply voltage of the RF power amplifier.

20 Claims, 8 Drawing Sheets

Related U.S. Application Data

(60) Provisional application No. 61/785,588, filed on Mar. 14, 2013.

(56) References Cited

U.S. PATENT DOCUMENTS

| | | |
|---|---|---|
| 2008/0278136 A1 | 11/2008 | Murtojarvi |
| 2009/0191826 A1 | 7/2009 | Takinami et al. |
| 2011/0095827 A1 | 4/2011 | Tanaka et al. |
| 2012/0062323 A1 | 3/2012 | Le Gallou et al. |
| 2012/0112838 A1 | 5/2012 | Hase et al. |
| 2013/0217345 A1 | 8/2013 | Balteanu et al. |
| 2014/0139199 A1 | 5/2014 | Khlat et al. |

OTHER PUBLICATIONS

Extended European Search Report from corresponding EP Application No. 14775696.9 dated Feb. 24, 2016.

\* cited by examiner

POWER SUPPLY

CROSS REFERENCE TO RELATED APPLICATIONS

This application claims the benefit under 35 U.S.C. §120 as a continuation of U.S. patent application Ser. No. 14/208,553, titled "POWER SUPPLY," filed on Mar. 13, 2014, which claims priority under 35 U.S.C. §119(e) to U.S. Provisional Patent Application Ser. No. 61/785,588, titled "POWER SUPPLY," filed on Mar. 14, 2013, each of which is hereby incorporated herein by reference in its entirety.

BACKGROUND

1. Field of the Disclosure

This application relates to power supplies, and more specifically to power supplies for envelope tracking power amplifier systems.

2. Description of the Related Art

Mobile devices communicate using a variety of wireless technologies, some of which use radio frequency (RF) power amplifier (PA) systems with envelope tracking power supplies to transmit wireless signals. Mobile devices also have batteries that provide a source of power for the RF PA system. However, the battery is a limited source of power. Thus, it is preferable for the power supply of the RF PA system to be power efficient. Additionally, the battery voltage can droop due to power demands from other circuits in the mobile device. The variance in the battery voltage can degrade the signal integrity of the RF PA system.

SUMMARY

Embodiments of the preset disclosure includes a power supply for a radio frequency (RF) power amplifier that amplifies an RF input signal into an RF output signal. The power supply comprises a first power converter to convert an input voltage to the power supply into a first supply voltage of the RF power amplifier. The power supply comprises a second power converter to receive the input voltage and the first supply voltage and to selectively convert either the input voltage or the first supply voltage into at least a portion of a second supply voltage of the RF power amplifier.

In one embodiment, the power supply further comprises a control circuit to generate a supply control signal for the second power converter based on an amplitude signal indicative of an amplitude of the RF input signal. The second power converter controls a level of the portion of the second supply voltage of the RF power amplifier based on the supply control signal. In another embodiment, the second power converter further selects either the input voltage or the first supply voltage for conversion based on a level of the input voltage to the power supply.

In another embodiment, the second power converter selectively converts either the input voltage or the first supply voltage into a first output voltage. A third power converter to receive the input voltage and to convert the input voltage into a second output voltage. A power combiner circuit to combine the first output voltage and the second output voltage into the second supply voltage of the RF power amplifier.

Embodiments of the preset disclosure includes a method of operation in the power supply. The method comprises converting, by a first power converter, an input voltage to the power supply into a first supply voltage of the RF power amplifier. The method further comprises selectively converting, by a first power converter, either the input voltage to the power supply or the first supply voltage of the RF power amplifier into at least a portion of a second supply voltage of the RF power amplifier.

BRIEF DESCRIPTION OF THE DRAWINGS

The teachings of the embodiments disclosed herein can be readily understood by considering the following detailed description in conjunction with the accompanying drawings.

DETAILED DESCRIPTION

Reference will now be made in detail to several embodiments, examples of which are illustrated in the accompanying figures. It is noted that wherever practicable similar or like reference numbers may be used in the figures and may indicate similar or like functionality. The figures and accompanying description depict various embodiments for purposes of illustration only. One skilled in the art will readily recognize from the following description that alternative embodiments of the structures and methods illustrated herein may be employed without departing from the principles described herein. As used herein, the terms "estimating" "determining" or "computing" may be used interchangeably with each other.

An ultra fast power supply architecture is disclosed. Its primary use is as an envelope tracking (ET) power supply in an envelope tracking (ET) power amplifier (PA) system. The power supply comprises two switching power converters (e.g., one buck/boost, one buck) and a linear power converter. The combination of the two switching power converters and linear power converter enables the power supply to maintain output power regulation for two power rails even when a battery input voltage droops. The combination of power converters also increases the flexibility of the power supply, allowing the power supply to be operated in different modes for greater power efficiency.

Figure 1:
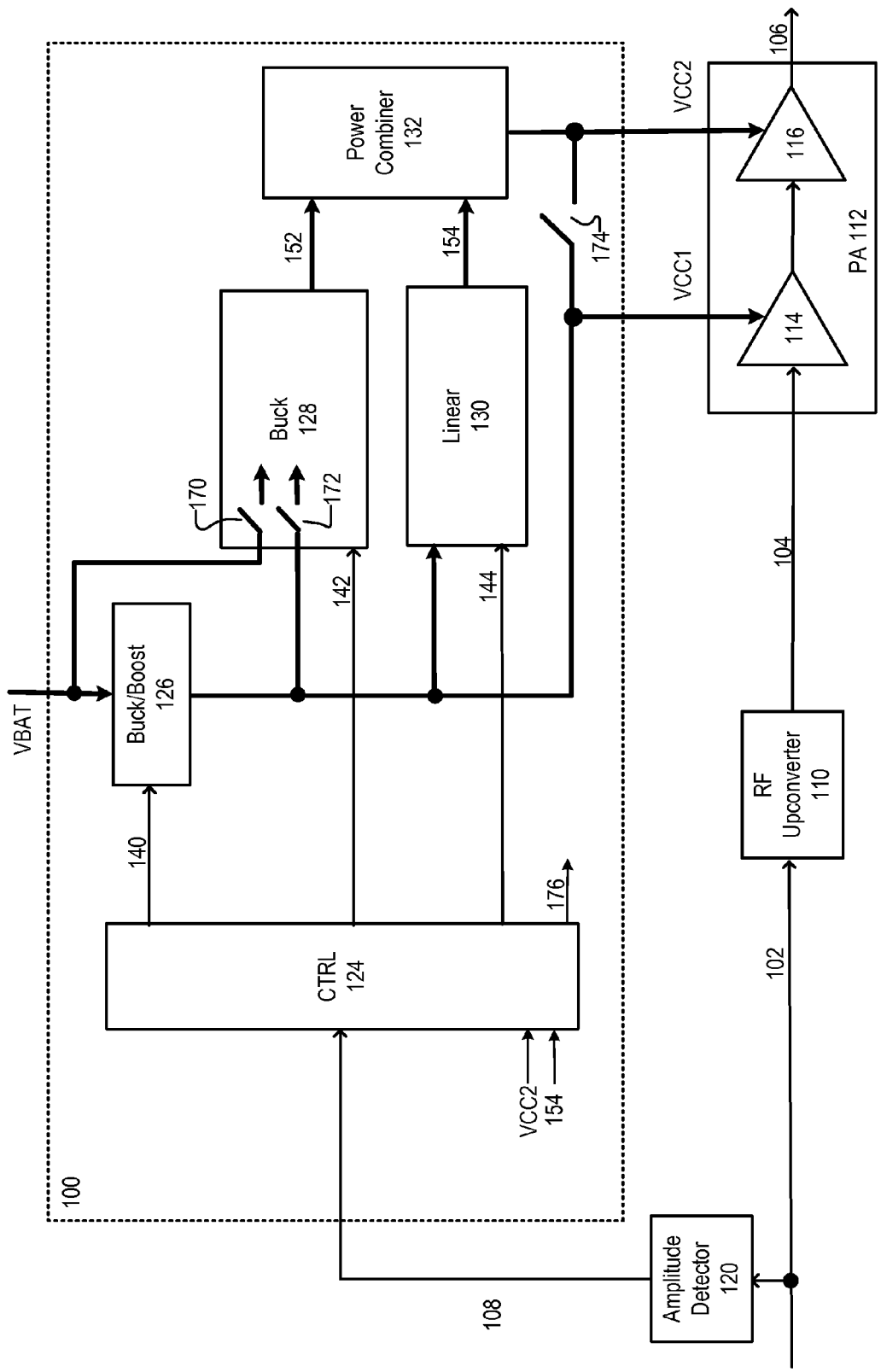
FIG. 1 is a RF PA system with an envelope tracking power supply, according to an embodiment.

FIG. 1 is a RF PA system with an envelope tracking power supply, according to an embodiment. The RF PA system can be found in a mobile communications device such as a cell phone that uses CDMA, LTE, etc. As shown, the RF PA system includes an amplitude detector 120, a RF upconverter 110, a power amplifier 112 and an envelope tracking power supply 100.

The RF upconverter circuit 110 receives a digital baseband signal 102. The RF upconverter 110 upconverts the baseband signal 102 to a carrier frequency and generates an RF input signal 104 having varying amplitude and phase. The power amplifier (PA) receives and amplifies the RF input signal 104 to generate an RF output signal 106. The RF output signal 106 is provided to an antenna (not shown) for transmission to a remote device.

In one embodiment, the PA 112 is a dual stage PA 112 with two amplification stages. The first stage 114 is powered by supply voltage VCC1. The second stage 116 follows the first stage 114 and is powered by a supply voltage VCC2. The second stage 116 may be larger and consume more power than the first stage 114. The PA 112 also has a bias input for a bias supply voltage (not shown).

The amplitude detector 120 receives the digital baseband signal 102 and generates an envelope amplitude signal 108 that tracks the envelope amplitude of the RF input signal 104. The amplitude detector can generate the amplitude signal 108 as a function of digital modulation components (I and Q) of the baseband signal 102. The envelope amplitude signal 108 may be a differential signal. In one embodiment the envelope amplitude signal 108 can be viewed as an adjustable and changing control signal that changes as the amplitude of the RF input signal 104 changes.

The envelope tracking power supply 100 converts a battery input voltage VBAT into supply voltages VCC1 and VCC2 for the PA 112. The supply voltages VCC1 and VCC2 may be controlled in envelope tracking modes during which VCC1 is held relatively constant and VCC2 tracks the instantaneous envelope amplitude of the amplitude signal 108. The supply voltages VCC1 and VCC2 may be controlled in average power tracking modes during which VCC1 and VCC2 roughly track an average envelope amplitude of the amplitude signal 108. The PA 112 is an example of a load of the envelope tracking power supply 100, although in other embodiments the power supply may be used to provide power to loads other than a PA 112. As shown, the envelope tracking power supply 100 includes a comparator circuit 122, a control circuit 124, a buck/boost power converter 126, a buck power converter 128, a linear power converter 130 and a power combiner circuit 132.

Control circuit 124 receives the envelope amplitude signal 108 and generates supply control signals 140, 142 and 144 for controlling the power converters 126, 128 and 130 according to the envelope amplitude signal 108. The supply control signals 140, 142 and 144 indicate individual target or desired voltage levels to be output by each of the power converters 126, 128 and 130. The power converters 126, 128 and 130 use their respective supply control signals 140, 142 and 144 in controlling their output voltage levels. Control circuit 124 may also generate enable signals (not shown) that are provided to the power converters 126, 128 and 130 for enabling or disabling the power converters 126, 128 and 130.

Additionally, control circuit 124 receives feedback signals indicating the level of the supply voltage VCC2 and the output voltage 154 of the linear power converter 130. These feedback signals can be used as closed loop feedback to control operation of the various power converters 126, 128 and 130 within the power supply 100.

Buck/boost converter 126 receives a battery voltage VBAT and generates supply voltage VCC1 from the battery input voltage VBAT. Buck/boost converter 126 is a switching power converter that can either step up or step down the battery input voltage VBAT to generate the supply voltage VCC1, depending on the target voltage level indicated by supply control signal 140 and the level of battery input voltage VBAT. If the target voltage level is higher than VBAT, buck/boost converter 126 operates in boost mode to generate a supply voltage VCC1 for PA 114 that is higher than VBAT. If the target voltage level is lower than VBAT, buck/boost converter 126 operates in buck mode to generate a supply voltage VCC1 that is lower than VBAT.

The output of the buck/boost converter 126 generally tracks the supply control signal 140. As the supply control signal 140 increases, the supply voltage VCC1 output by the buck/boost converter 126 increases. As the supply control signal 140 decreases, the supply voltage VCC1 output by the buck/boost converter 126 decreases. The buck/boost converter 126 may include components such as an inductor (not shown) to help regulate the output of the buck/boost power converter 126.

Buck converter 128 receives the battery input voltage VBAT and the supply voltage VCC1. Buck converter 128 generates a buck output supply voltage 152 from either the battery input voltage VBAT or supply voltage VCC1 under the control of the supply control signal 142. Buck converter 128 is a step down switching power converter that can only step down an input voltage to a lower buck output supply voltage 152. As the supply control signal 142 increases, the buck output supply voltage 152 increases. As the supply control signal 142 decreases, the buck output supply voltage 152 decreases.

Buck converter 128 is also a dual rail power converter that uses either of its two input voltages (VBAT, VCC1) to generate the buck output supply voltage 152. Buck converter 128 includes two switches 170 and 172 that select either the battery input voltage VBAT or the supply voltage VCC1 for use in generating the buck output supply voltage 152.

Figure 1A:
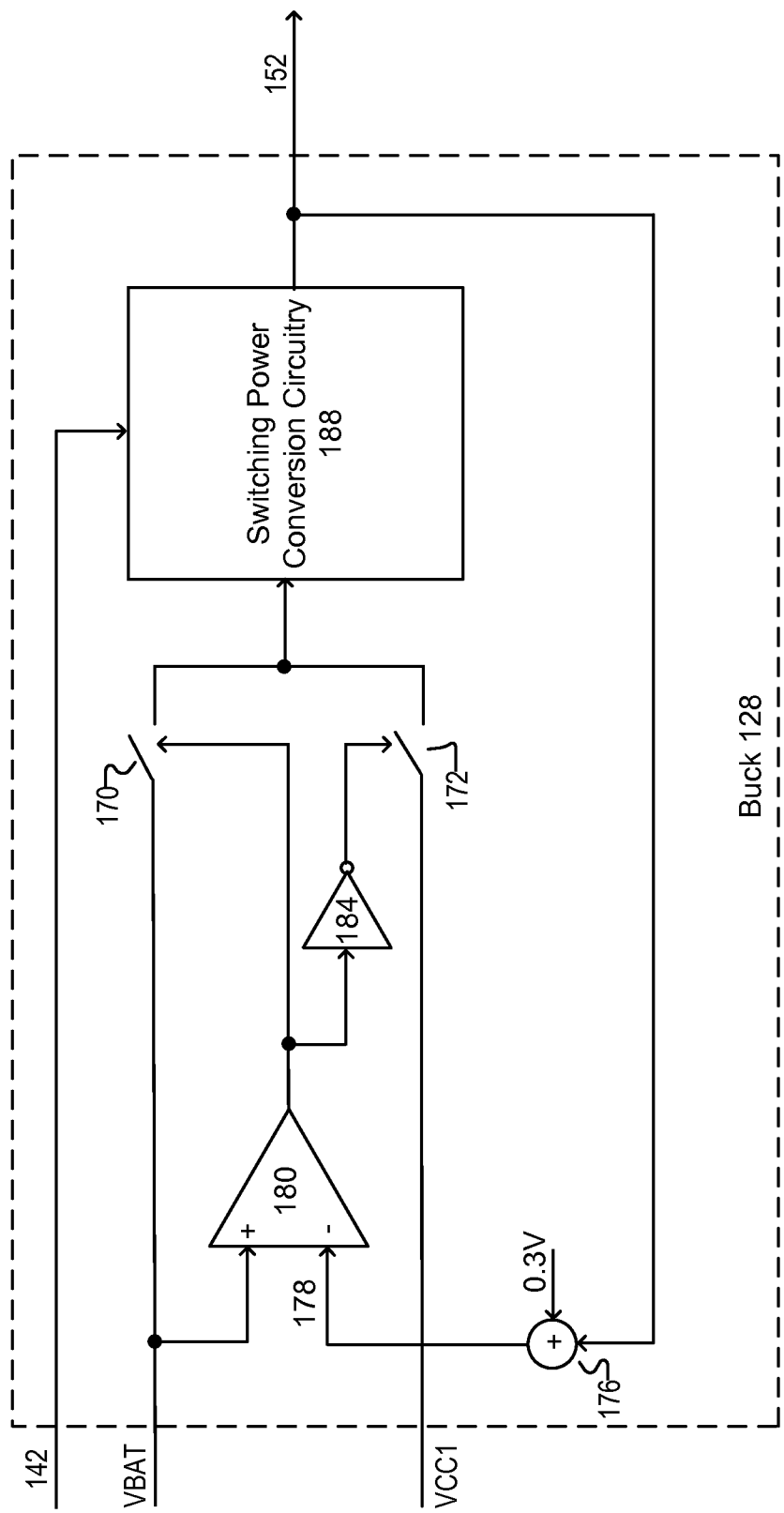
FIG. 1A is a buck converter from FIG. 1, according to an embodiment.

Referring now to FIG. 1A, illustrated is a buck converter 128 from FIG. 1, according to an embodiment. Buck converter 128 includes a reference generator 176, a comparator 180, an inverter 184 and switching power conversion circuitry 188. Reference generator 176 adds 0.3 V to the buck output voltage 152 to generate a threshold reference voltage 178 (buck output voltage 152+0.3V). Comparator 180 compares the threshold reference voltage 178 to VBAT and generates an output signal that is provided to switch 170, and inverted with inverter 184 and provided to switch 172. Generally if the VBAT level is higher than the threshold reference voltage 178, then switch 170 is closed to provide VBAT as an input to the switching power conversion circuitry 188. On the other hand if the VBAT level is lower than the threshold reference voltage 178, switch 172 is opened to provide VCC1 as an input to the switching power conversion circuitry 188 (assuming VCC1 is higher than VBAT). This selection assumes that VBAT will used when it is has sufficient margin to generate a target voltage at its output. Switching power conversion circuitry 188 uses the selected voltage (VBAT or VCC1) to generate the buck output supply voltage 152.

Referring back to FIG. 1, in another embodiment, the input voltage that is selected depends on the target output voltage indicated by supply control signal 142 and the level of the battery input voltage VBAT. The buck converter 128 compares the supply control signal 142 to a threshold reference voltage determined by VBAT (e.g., VBAT−0.3V). If the target output voltage is lower than the threshold reference voltage, buck power converter 128 uses the battery input voltage VBAT to generate the buck output supply voltage 152. If the target output voltage is higher than the threshold reference voltage, buck converter 128 uses the supply voltage VCC1 to generate the buck output supply voltage 152 (assuming that VCC1 is higher than VBAT).

The dual nature of the buck power converter 128 allows the power supply 100 to have good power efficiency while still being able to handle to handle dips in the battery input voltage VBAT. When the battery input voltage VBAT provides sufficient headroom, it can be directly used by the buck converter 128 to generate a buck output supply voltage 152 with high efficiency. When the battery input voltage VBAT does not provide sufficient headroom, the power supply 100 can use supply voltage VCC1 to generate a buck output supply voltage 152 with only a small decrease in efficiency due to losses into the buck/boost converter 126.

Linear power converter 130 is a liner amplifier that receives supply voltage VCC1 and generates a linear output supply voltage 154 under the control of supply control signal 144. As the supply control signal 144 increases, the linear output supply voltage 154 increases. As the supply control signal 144 decreases, the linear output supply voltage 154 decreases.

Linear power converter 130 can operate at a higher frequency than buck/boost converter 126 and buck converter 128, which include switching elements causing them to operate at a lower frequency. However, linear power converter 130 has lower power efficiency than buck/boost converter 126 and buck converter 128. The control circuit 124 uses the linear power converter 130 to compensate for fast changes in the envelope of the RF input signal 104, while buck/boost converter 126 and buck converter 128 may be used to compensate for slower changes with higher power efficiency.

Figure 1B:
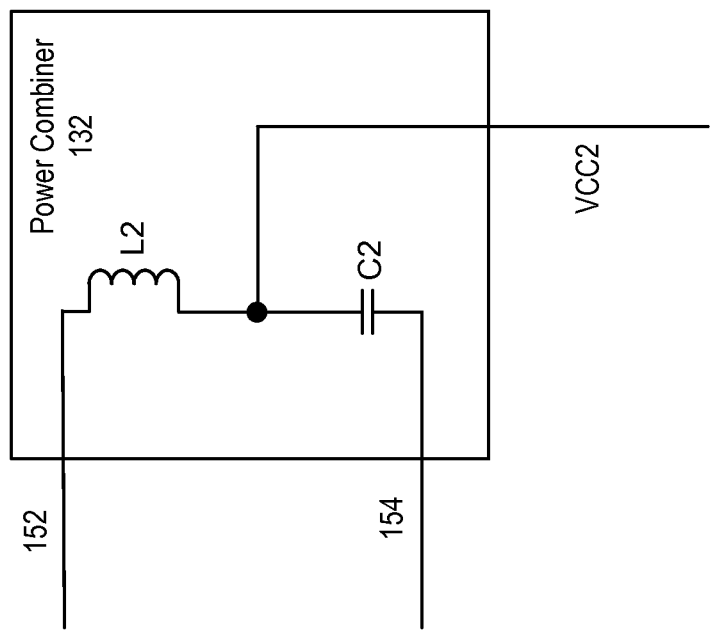
FIG. 1B is a power combiner circuit from FIG. 1, according to an embodiment.

The buck output supply voltage 152 and linear output supply voltage 154 are combined with a frequency blocking power combiner circuit 132. The output of the frequency blocking power combiner circuit 132 is a combined voltage output that serves as supply voltage VCC2. FIG. 1B illustrates a frequency blocking power combiner circuit 132 from FIG. 1, according to an embodiment. Frequency blocking power combiner circuit 132 includes an inductor L2 and capacitor C2. Capacitor C2 passes the higher frequency linear output supply voltage 154, while blocking the lower frequency buck output supply voltage 152. Inductor L2 passes the lower frequency buck output supply voltage 152 while blocking the higher frequency linear output supply voltage 154.

The two output supply voltages 152 and 154 are thus combined to generate a combined output voltage that serves as the supply voltage VCC2 for PA 116. Both supply voltages 152 and 154 contribute to a portion of the supply voltage VCC2. During low frequency envelope amplitude changes of the RF input signal 104, the supply voltage VCC2 may be completely generated from the buck output supply voltage 152.

The control circuit 124 may operate the power supply 100 in either an envelope tracking mode of operation or an average power tracking (APT) mode of operation, depending on the level of the envelope amplitude signal 108. Envelope tracking modes of operation are described by reference to FIG. 2 and FIG. 3. During the envelope tracking operation modes, the power supply 100 makes supply voltage VCC1 constant and controls supply voltage VCC2 so it substantially tracks the instantaneous envelope amplitude of the RF input signal 104. Envelope tracking modes generally occur during situations when the envelope amplitude of the RF input signal 104 is high, i.e. above a certain threshold, such that the envelope amplitude of the RF input signal being tracked with high accuracy.

In envelope tracking mode, the control signal 140 is generated to have a constant voltage. Control signal 142 is generated to track the slow changes in the amplitude signal 108, for example, by passing amplitude signal 108 through a low pass filter. This causes the buck output voltage 152 to track slow changes in the envelope amplitude of the RF input signal 104. Control signal 144 is generated to track faster changes in the amplitude signal 108, for example, by passing amplitude signal 108 through a high pass filter. This causes the linear output voltage 154 to track fast changes in the envelope amplitude of the RF input signal 104.

Average power tracking (APT) modes of operation are described by reference to FIG. 4, FIG. 5 and FIG. 6. During the average power tracking (APT) mode of operation, the power supply 100 controls supply voltage VCC1 and VCC2 to track the average envelope amplitude of the RF input signal 104. The average envelope may be an average over a period of time, such as several modulation cycles of the baseband signal (e.g., 0.5. ms). APT modes generally occur during situations when the envelope amplitude of the RF input signal 104 is low, i.e. below a certain threshold, such that the envelope amplitude of the RF input signal is not being tracked with high accuracy.

In APT mode, the control signal 140 is generated to track slow changes in the amplitude signal 108. This causes VCC2 to track the average envelope amplitude of the RF input signal 104. Buck regulator 128 and linear regulator 130 may both be disabled as shown in FIG. 4. Alternatively control signal 142 may be generated to track slow changes in the amplitude signal 108, as shown in FIG. 5.

A switch 174 is also coupled between supply voltage VCC1 and supply voltage VCC2. Switch 174 can be a transistor switch that is closed or opened under the control of switch control signal 176 generated by the control circuit 124. Typically switch 174 is open so that supply voltage VCC1 and supply voltage VCC2 can be controlled separately from each other. In an average power tracking mode of operation, control circuit 124 can generate switch control signal 176 to close switch 174 such that buck/boost converter 126 generates both supply voltage VCC1 and supply voltage VCC2.

In one embodiment, the control circuit 124 compares the envelope amplitude signal 108 to a threshold voltage level (e.g. 3 V). If the envelope amplitude signal 108 is above the threshold, the control circuit 124 generates control signals 140, 142 and 144 to operate the power supply 100 in an envelope tracking mode of operation. On the other hand, if the envelope amplitude signal 108 is below the threshold, the control circuit 124 may generate control signals 140, 142 and 144 to operate the power supply 100 in the APT mode of operation.

Figure 2:
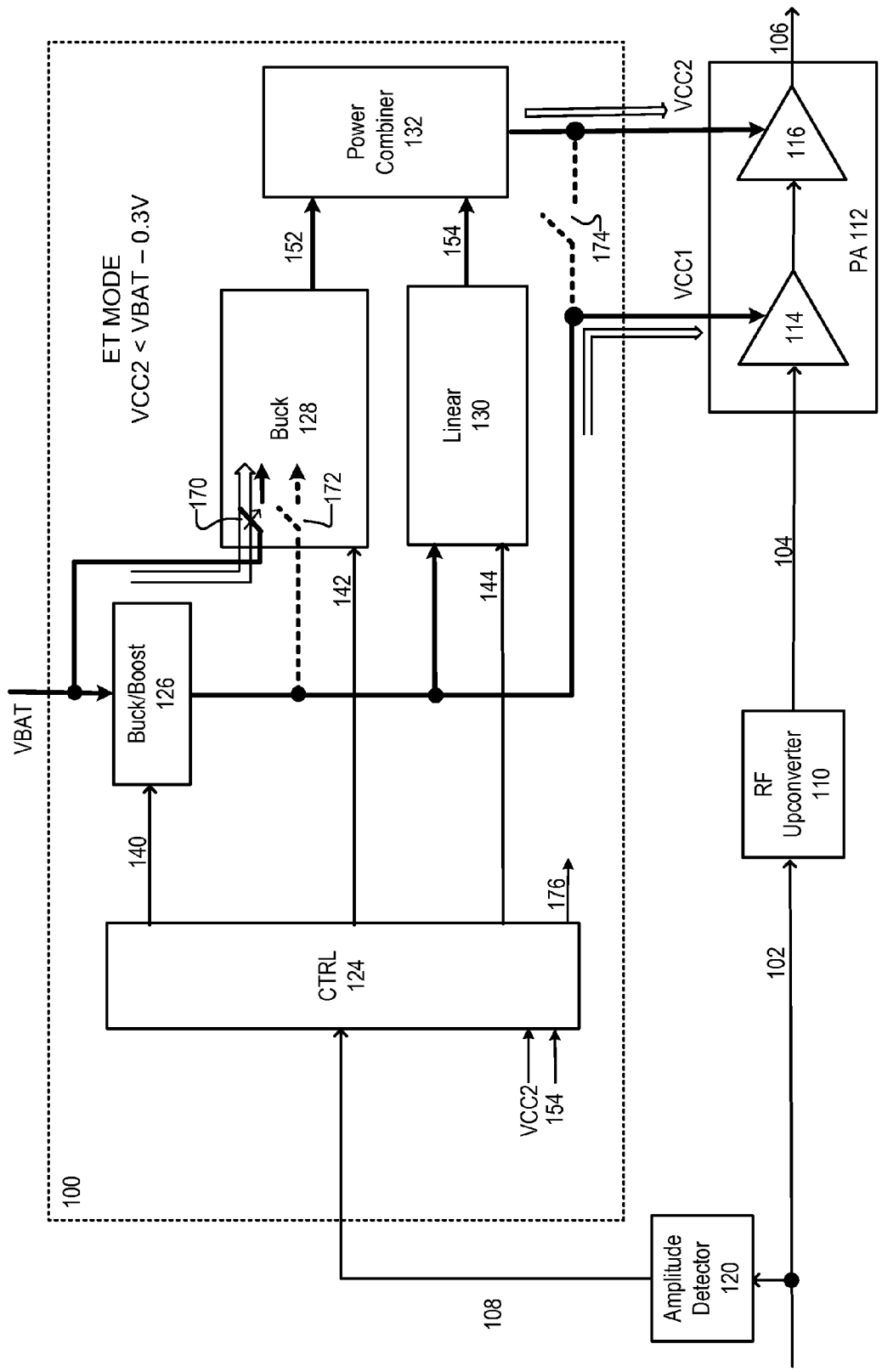
FIG. 2 is a RF PA system powered by an envelope tracking power supply during an envelope tracking mode of operation, according to an embodiment.

FIG. 2 is a RF PA system powered by an envelope tracking power supply during an envelope tracking mode of operation, according to an embodiment. Buck/boost converter 126 can be operating in a buck or boost configuration to generate supply voltage VCC1. Linear amplifier is powered by supply voltage VCC1. Switch 174 is open so that supply voltage VCC1 and VCC2 operate independently of each other. Power supply 100 controls supply voltage VCC2 so that it substantially tracks the instantaneous envelope amplitude of the RF input signal 104. This is considered the normal VBAT envelope tracking mode of operation.

In this mode, the target level of the supply voltage VCC2 is less than a threshold, defined by battery voltage VBAT minus 0.3 V. Battery voltage VBAT thus has enough headroom to be used by the buck converter 128 as an input voltage. To select VBAT as the input voltage, buck converter

128 closes switch 170 while opening switch 172. Using VBAT as the input voltage to the buck converter 128 in this mode reduces power consumption by avoiding potential power losses caused by the buck/boost converter 126.

Figure 3:
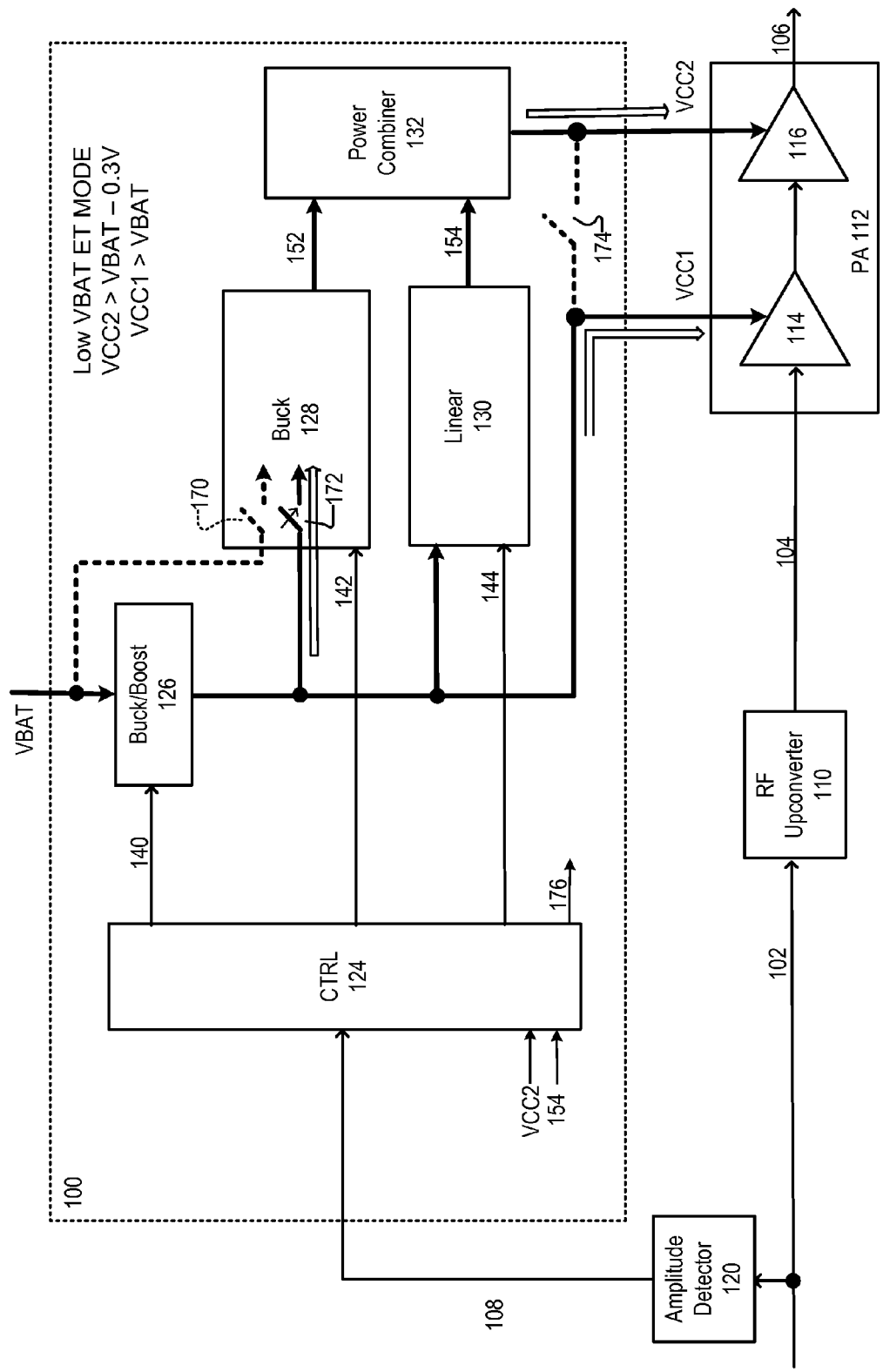
FIG. 3 is a RF PA system powered by an envelope tracking power supply during another envelope tracking mode of operation, according to an embodiment.

FIG. 3 is a RF PA system powered by an envelope tracking power supply 100 during another envelope tracking mode of operation, according to an embodiment. Like FIG. 2, FIG. 3 represents an envelope tracking mode during which the power supply 100 controls supply voltage VCC2 so that it substantially tracks the instantaneous envelope amplitude of the RF input signal 104. However, by contrast to FIG. 2, the target level of supply voltage VCC2 now is more than the threshold voltage of VBAT minus 0.3V. The low level of the battery input voltage VBAT may be caused by dips in the battery input voltage VBAT. This is considered the low VBAT envelope tracking mode of operation.

In FIG. 3, battery input voltage VBAT no longer has enough headroom to be used by buck converter 128 as an input voltage while still generating a buck output supply voltage 152 that meets the target voltage level. Buck/boost converter 126 is operated in boost mode so that supply voltage VCC1 is greater than the battery input voltage VBAT. Supply voltage VCC1 has enough headroom to be used by buck converter 128 as an input voltage. To select supply voltage VCC1 as an input voltage, buck converter 128 closes switch 172 and opens switch 170. Thus, even though the battery voltage VBAT has dipped, buck converter 128 is still able to generate a buck output supply voltage 152 that maintains the supply voltage VCC2 voltage at its desired level.

Figure 4:
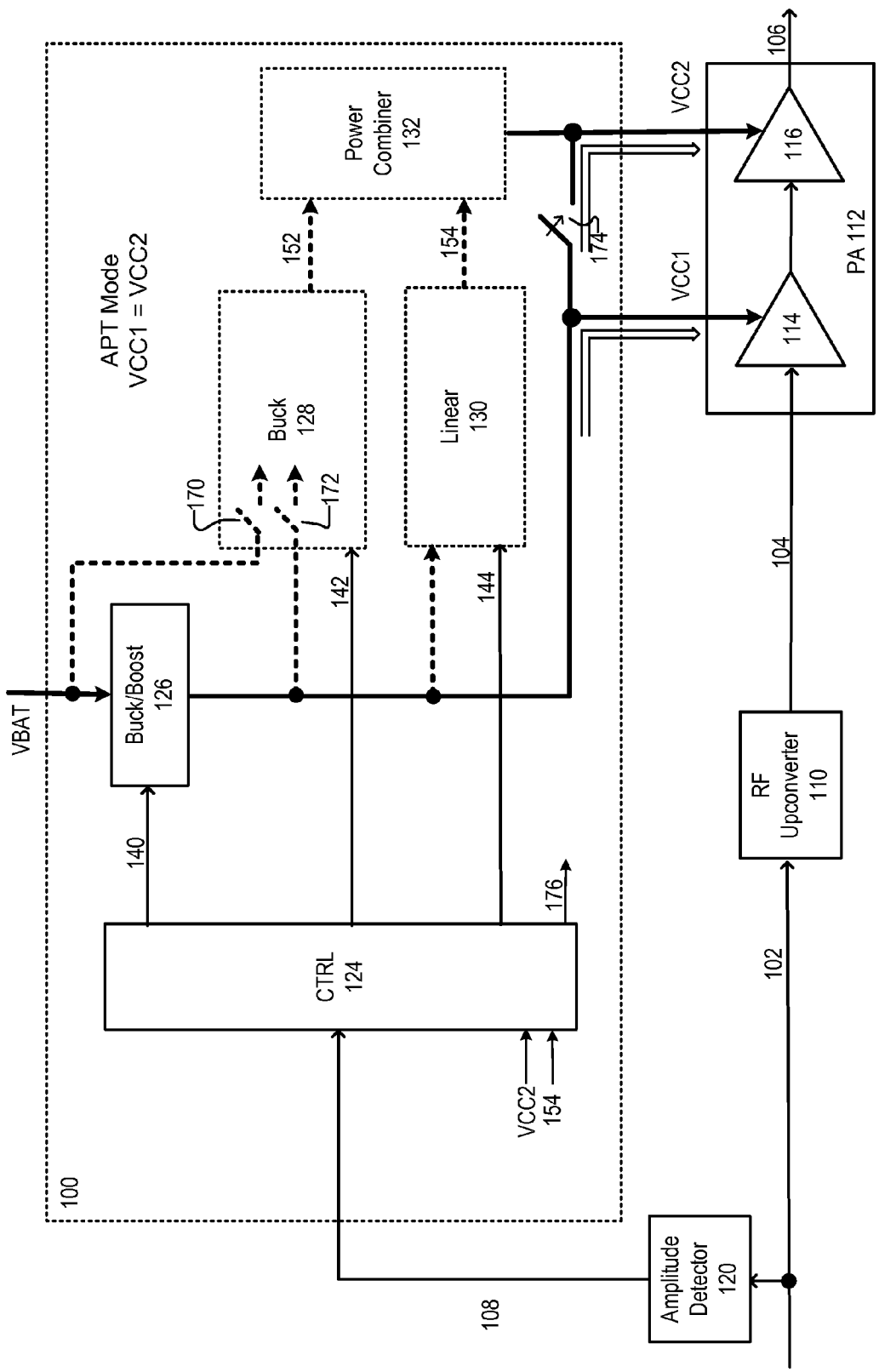
FIG. 4 is a RF PA system powered by an envelope tracking power supply during an average power tracking mode of operation, according to an embodiment.

FIG. 4 is a RF PA system powered by an envelope tracking power supply 100 during an average power tracking mode of operation, according to an embodiment. Buck converter 128 and linear converter 130 are disabled by the control circuit 124 through their enable inputs. Switch 174 is closed to bypass buck converter 128 and linear converter 130, which causes supply voltage VCC1 to be connected to supply voltage VCC2. Buck/boost converter 126 thus provides both supply voltages VCC1 and VCC2. As the buck/boost converter 126 produces an output that tracks the average envelope amplitude of the RF input signal 104, both supply voltage VCC1 and VCC2 also track the average envelope amplitude of the RF input signal. The APT mode operates in high efficiency because a single buck/boost converter 126 provides both supply voltages VCC1 and VCC2. This is considered the normal APT mode of operation.

Figure 5:
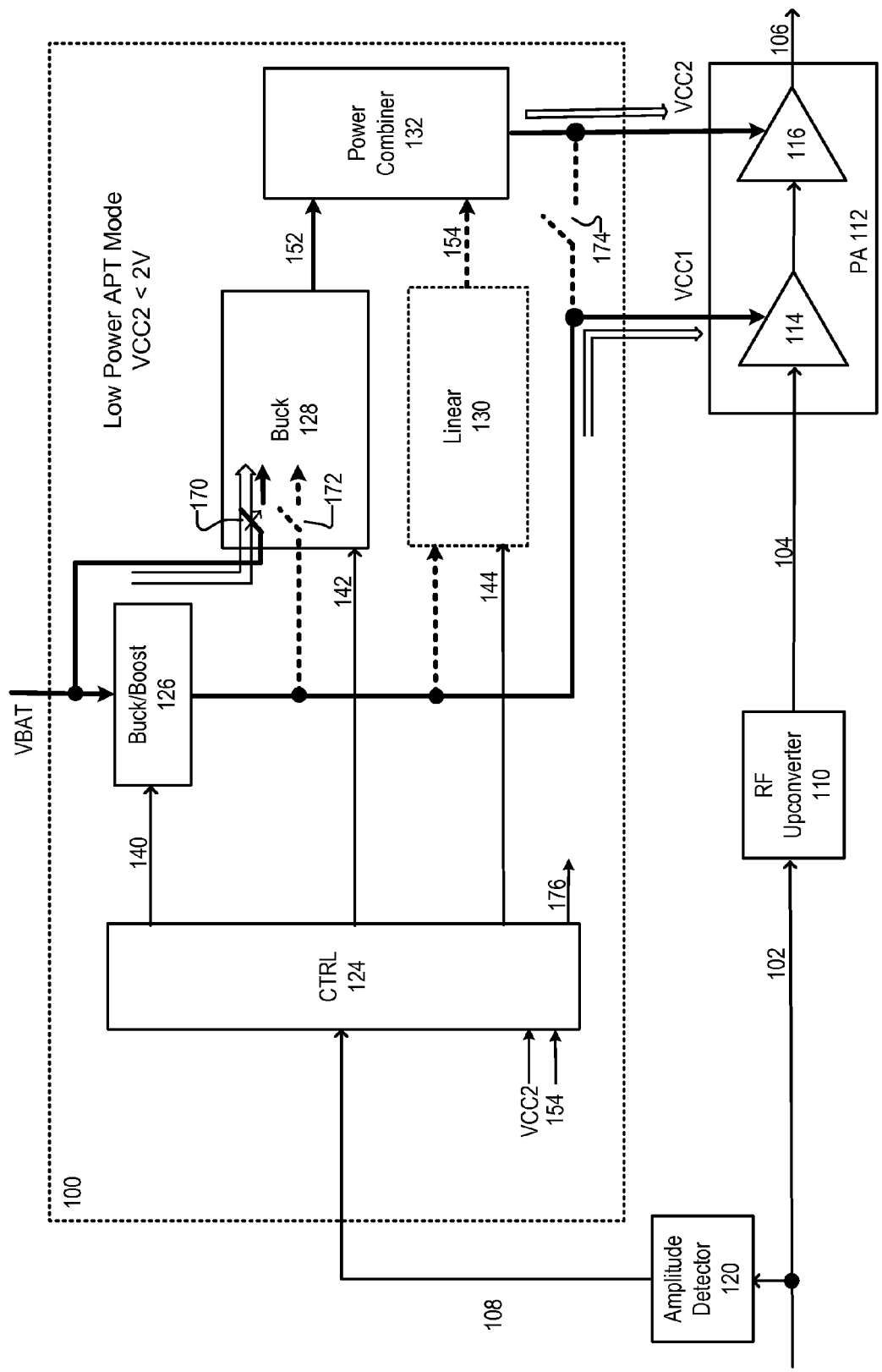
FIG. 5 is a RF PA system powered by an envelope tracking power supply during another average power tracking mode of operation, according to an embodiment.

FIG. 5 is a RF PA system powered by an envelope tracking power supply 100 during another average power tracking mode of operation, according to an embodiment. In this mode the target level of the supply voltage VCC2 is less than a threshold (e.g. 2V). Supply voltage VCC2 is operated at a low voltage, which may be lower than supply voltage VCC1, to save power. This is considered the low-power APT mode of operation. Linear power converter 130 is disabled and not used.

Buck converter 128 is enabled and selects the battery input voltage VBAT for use in generating the buck output voltage 152. As linear converter 130 is disabled, the buck output supply voltage 152 is the same as supply voltage VCC2. Buck/boost converter 126 and buck converter 128 can generate outputs that result in different supply voltages. For example, supply voltage VCC1 can be 0.7 V and supply voltage VCC2 can be 0.5 V.

Both VCC1 and VCC2 may be controlled to track an average envelope of the RF input signal 104, but they may track different averages. For example VCC1 may track a longer average over 10 ms through control of the control signal 140. VCC2 may track a shorter average over 0.5 ms through control of the control signal 142.

Figure 6:
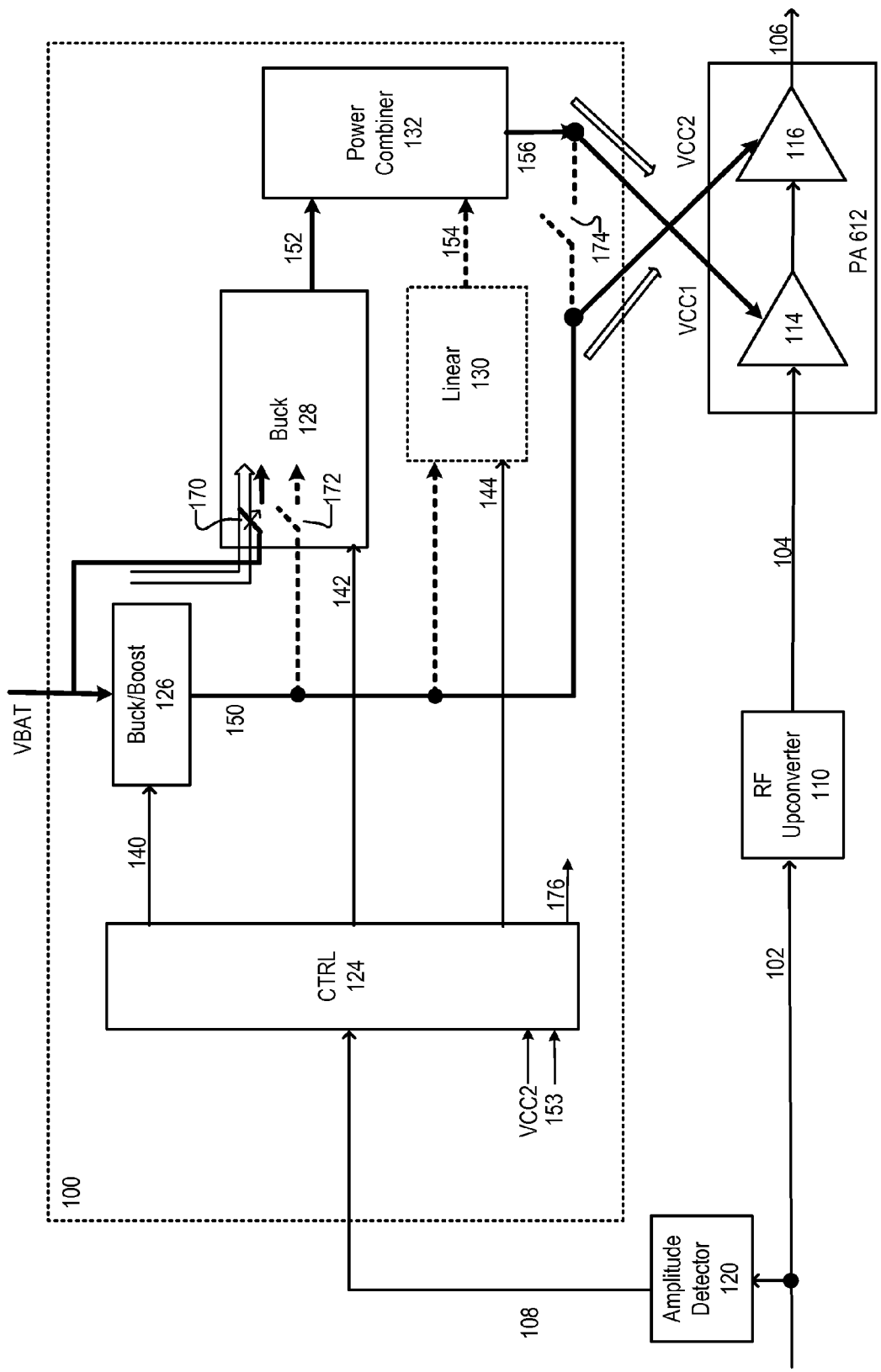
FIG. 6 is a RF PA system powered by an envelope tracking power supply, according to another embodiment.

FIG. 6 is a RF PA system powered by an envelope tracking power supply 100, according to another embodiment. This RF PA system of FIG. 6 is similar to the RF PA system of FIG. 5, except that the connections for supply voltage VCC1 and supply voltage VCC2 are reversed. Supply voltage VCC1 is now supplied by buck converter 128 via the power combiner 132. Supply voltage VCC1 is now supplied by buck/boost converter 126. Linear converter 130 is still disabled.

The PA 612 in FIG. 6 may be different than the PA 112 from FIG. 1. Some RF PA systems include multiple PAs that may be powered by the same power supply. Thus, PA 112 may represent one PA in the RF PA system, and PA 612 may represent a different PA in the same RF PA system.

The RF PA system of FIG. 6 operates in an APT mode. Buck/boost converter 126 is used to boost the level of supply voltage VCC2 higher than the battery voltage VBAT. Supply voltage VCC1 tracks the average envelope amplitude of the RF input signal 104. The configuration of FIG. 6 is typically used for a PA 612 that requires boosting of the second stage 116. These types of PAs 612 may operate at higher efficiency with higher voltages for the second stage 116.

Upon reading this disclosure, those of skill in the art will appreciate still additional alternative designs for a power supply. Thus, while particular embodiments and applications of the present disclosure have been illustrated and described, it is to be understood that the embodiments are not limited to the precise construction and components disclosed herein and that various modifications, changes and variations which will be apparent to those skilled in the art may be made in the arrangement, operation and details of the method and apparatus of the present disclosure disclosed herein without departing from the spirit and scope of the disclosure as defined in the appended claims.

What is claimed is:

1. A radio frequency power amplifier system comprising:
 a power amplifier configured to receive a radio frequency input signal, a first supply voltage, and a second supply voltage and to amplify the radio frequency input signal into a radio frequency output signal; and
 a power supply coupled to the power amplifier, the power supply including a first power converter configured to receive an input voltage and generate a first output voltage and a second power converter configured to receive the first output voltage and generate a second output voltage, the power supply being configured to provide the first output voltage to the power amplifier as both the first supply voltage and the second supply voltage responsive to being in a first mode of operation and to provide the first output voltage to the power amplifier as the first supply voltage and provide at least a portion of the second output voltage to the power amplifier as the second supply voltage responsive to being in a second mode of operation.

2. The radio frequency power amplifier system of claim 1 further comprising an amplitude detector configured to generate an amplitude signal indicative of an amplitude of the radio frequency input signal.

3. The radio frequency power amplifier system of claim 2 wherein the power supply is configured to select one of the first mode of operation and the second mode of operation based on the amplitude signal.

4. The radio frequency power amplifier system of claim 1 wherein the power supply is configured to disable the second power converter responsive to being in the first mode of operation.

5. The radio frequency power amplifier system of claim 1 wherein the power supply further includes a third power converter configured to receive the first output voltage and generate a third output voltage.

6. The radio frequency power amplifier system of claim 5 wherein the power supply further includes a power combiner coupled to the second power converter and the third power converter, the power combiner configured to combine the second output voltage with the third output voltage to generate a fourth output voltage.

7. The radio frequency power amplifier system of claim 6 wherein the power supply is configured to provide the first output voltage to the power amplifier as the first supply voltage and provide the fourth output voltage to the power amplifier as the second supply voltage responsive to being in a third mode of operation.

8. The radio frequency power amplifier system of claim 5 wherein the power supply is configured to disable the third power converter responsive to being in at least one of the first mode of operation and the second mode of operation.

9. The radio frequency power amplifier system of claim 1 wherein the second power converter is configured to receive the input voltage and selectively convert either the input voltage or the first output voltage into the second output voltage.

10. A power supply for a radio frequency power amplifier that amplifies a radio frequency input signal into a radio frequency output signal, the power supply comprising:
a first power converter configured to receive an input voltage and generate a first output voltage;
a second power converter configured to receive the first output voltage and generate a second output voltage; and
a controller coupled to the first power converter and the second power converter, the controller being configured to receive a signal indicative of an amplitude of the radio frequency input signal and select a mode of operation of the power supply from a plurality of modes based on the signal, the plurality of modes including a first mode of operation that provides only the first output voltage to the power amplifier and a second mode of operation that provides the first output voltage and at least a portion of the second output voltage to the power amplifier.

11. The power supply of claim 10 further comprising a first output terminal coupled to the first power converter to provide the first output voltage to the power amplifier and a second output terminal coupled to the second power converter to provide at least one of the first output voltage and the portion of the second output voltage to the power amplifier.

12. The power supply of claim 11 further comprising a switch coupled between the first output terminal and the second output terminal, the controller being configured to close the switch in the first mode of operation and open the switch in the second mode of operation.

13. The power supply of claim 10 wherein the second power converter is configured to receive the input voltage of the power supply and selectively convert either the input voltage or the first output voltage into the second output voltage.

14. The power supply of claim 10 further comprising a third power converter configured to convert the first output voltage into a third output voltage.

15. The power supply of claim 14 further comprising a power combiner coupled to the second power converter and the third power converter, the power combiner being configured to combine the second output voltage with the third output voltage to generate a fourth output voltage.

16. The power supply of claim 15 wherein the plurality of modes includes a third mode of operation that provides the first output voltage and the fourth output voltage to the power amplifier.

17. A power supply for a radio frequency power amplifier that amplifies a radio frequency input signal into a radio frequency output signal, the power supply comprising:
a first power converter configured to convert an input voltage to the power supply into a first output voltage; and
a second power converter configured to receive the input voltage and the first output voltage and to selectively convert either the input voltage or the first output voltage into at least a portion of a supply voltage for the radio frequency power amplifier based on a magnitude of the input voltage.

18. The power supply of claim 17 further comprising a power combiner circuit configured to combine a second output voltage of the second power converter with a third output voltage to generate the supply voltage for the radio frequency power amplifier.

19. The power supply of claim 18 further comprising a third power converter configured to receive the first output voltage and to convert the first output voltage into the third output voltage.

20. The power supply of claim 17 further comprising a controller configured to generate a supply control signal for the second power converter based on an amplitude signal indicative of an amplitude of the radio frequency input signal, the second power converter controlling a level of the portion of the supply voltage for the radio frequency power amplifier based on the supply control signal.

* * * * *